(12) United States Patent
Harris et al.

(10) Patent No.: US 7,783,377 B2
(45) Date of Patent: Aug. 24, 2010

(54) SUBSTRATE LOADING AND UNLOADING APPARATUS

(75) Inventors: Paul Harris, Haverhill (GB); John Tingay, Cottenham (GB); Martin Turnidge, Cambridge (GB)

(73) Assignee: Leica Microsystems Lithography (GB)

( * ) Notice: Subject to any disclaimer, the term of this patent is extended or adjusted under 35 U.S.C. 154(b) by 1629 days.

(21) Appl. No.: 10/644,185

(22) Filed: Aug. 20, 2003

(65) Prior Publication Data
US 2004/0037676 A1 Feb. 26, 2004

(30) Foreign Application Priority Data
Aug. 22, 2002 (GB) .................. 0219608.7

(51) Int. Cl.
*G06F 7/00* (2006.01)
(52) U.S. Cl. .................. 700/218; 700/213; 700/121
(58) Field of Classification Search .................. 700/218, 700/213, 121
See application file for complete search history.

(56) References Cited

U.S. PATENT DOCUMENTS

| | | | |
|---|---|---|---|
| 3,968,885 A * | 7/1976 | Hassan et al. ................ | 414/591 |
| 4,642,438 A | 2/1987 | Beumer et al. | |
| 5,092,729 A | 3/1992 | Yamazaki et al. | |
| 5,996,488 A * | 12/1999 | Yanagisawa et al. ......... | 101/170 |
| 6,236,904 B1 * | 5/2001 | Nakamura ................ | 700/218 |
| 2001/0022652 A1 | 9/2001 | Van Schaik et al. | |
| 2001/0022930 A1 * | 9/2001 | Tanigawa .................. | 414/609 |
| 2003/0053893 A1 * | 3/2003 | Matsunaga et al. .......... | 414/217 |

FOREIGN PATENT DOCUMENTS

| | | |
|---|---|---|
| EP | 0242067 A2 | 10/1987 |
| EP | 0272141 A2 | 6/1988 |
| JP | 100102249 | 4/1998 |
| JP | 110354405 | 12/1999 |

* cited by examiner

*Primary Examiner*—Gene Crawford
*Assistant Examiner*—Ramya Prakasam
(74) *Attorney, Agent, or Firm*—Houston Eliseeva, LLP

(57) ABSTRACT

Substrate loading and unloading apparatus for automated loading and unloading of substrates (S) in a vacuum environment, for example the work region (A) of an electron beam lithography machine, comprises a substrate holder (13) with a substrate support table (17) and locating means (18 to 21) co-operable with the table to cause a supported substrate (S) to be pressed against and thereby located on the table (17). A vacuum vessel (10) defines a loading and unloading chamber (11) with a transfer port (12) which is communicable with the evacuated region (A) of the machine and permits transfer of the holder (13) between the chamber (11) and the region (A) entirely within the vacuum environment. Release means (22, 23; 28 to 33) are present to withhold the co-operation of the table and locating means and to provide a temporary substrate support clear of the table so that substrates can be transferred to and from the table. The temporary support can be provided by support pins (28) which may additionally be rotatable for fine adjustment of the substrate angular position.

53 Claims, 2 Drawing Sheets

SUBSTRATE LOADING AND UNLOADING APPARATUS

CROSS REFERENCE TO RELATED APPLICATIONS

This application claims priority of the British patent application 02 19 608.7 which is incorporated by reference herein.

FIELD OF THE INVENTION

The present invention relates to a substrate loading and unloading apparatus for automated loading and unloading of substrate in a vacuum environment.

BACKGROUND OF THE INVENTION

Processing of substrates, for example wafers intended to bear integrated circuits, is often carried out in a vacuum environment in which electron beam writing of patterns or substrates can be performed efficiently and with degrees of precision and fineness scale and detail beyond the capabilities of other writing techniques. Mass production of substrates with written patterns requires repeated movement of new substrates into the writing zone and removal of processed substrates from the zone, in each instance with relief and subsequent reinstatement of the vacuum. This consumes an appreciable proportion of the processing time for the substrates and thus increases the unit production cost. Substrate loading and unloading, in particular of a dedicated substrate holder, is generally carried out manually by a skilled operative, who must remove the holder from the machine, unload the processed substrate, fit a new substrate and reinsert the holder. In addition, fine adjustment of the substrate position in the holder, if needed, has to be carried out as a separate operation and requires the exercise of skill and knowledge.

SUMMARY OF THE INVENTION

It is accordingly the principal object of the present invention to provide apparatus by which loading of substrates onto and unloading of substrates from, for example, a substrate holder can be accomplished in an automated manner, i.e. without the need for direct manual intervention in the loading and unloading zone, in a vacuum environment so that the vacuum can be maintained between processing actions on successive substrates.

A subsidiary object of the invention is to enable automated adjustment of the substrate position in the vacuum environment so that adjustment can be achieved without the need for skilled manual operations.

Other objects and advantages of the invention will be apparent from the following description.

According to the present invention there is provided substrate loading and unloading apparatus for automated loading and unloading of substrates in a vacuum environment, comprising a substrate holder with a substrate support table and locating means co-operable with the table to cause a supported substrate to be pressed against and thereby located on the table, a vacuum vessel defining a loading and unloading chamber with a transfer port which is communicable in use with an evacuated region and permits transfer of the holder between the chamber and the region in a vacuum environment, and release means for withholding co-operation of the locating means and the table and providing a temporary substrate support clear of the table so as to permit transfer of a substrate to and from the holder.

Substrate loading and unloading apparatus of this kind is particularly suitable for use as part of an automated substrate loading and unloading system in a substrate processing machine in which processing has to be carried out in a vacuum environment. Through communication of the loading and unloading chamber of the apparatus with the evacuated region of the machine by way of the transfer port of the chamber, the vacuum environment is extended to the apparatus, which thus does not require an own vacuum-generating system. Rather than removal from the machine for substrate loading and unloading, the holder can remain within the vacuum environment and be passed back and forth between the evacuated region, in which the actual substrate processing is carried out, and the chamber, in which substrates to be processed can be loaded into and processed substrates unloaded from the holder. Transfer of the holder between the evacuated region of the machine and the loading and unloading chamber and transfer of substrates to and from the holder can be carried out by way of a remotely actuable transfer system integrated in the machine and engaging through the transfer port. The vacuum environment can thus be constantly maintained subject only to provision for supply of further substrates to and removal of processed substrates from the machine, which can be carried out by way of an air lock affecting only a small zone of the evacuated region. Loss of processing time due to repeated relief of the evacuated region and reinstatement of the vacuum for the purpose of substrate changeover is thus eliminated or significantly reduced. The automated vacuum loading and unloading can also reduce the time cost for skilled personnel and the potential for handling errors of the kind occurring with manual loading and unloading externally of the machine.

Preferably, the locating means defines a reference plane for a top face of the supported substrate. This ensures that the critical surface of each substrate, for example the top face of a wafer to be processed by writing of a pattern, is disposed in a consistently repeatable position. The plane is preferably defined by three spaced-apart contact points for contacting the substrate top face, so that the substrate can be pressed towards the table at locations ensuring an even distribution of force and promoting flattening of the substrates to counteract any intrinsic bowing, twisting or other distortion of the substrates. The contact points can be provided by contact surfaces of stop members disposed above the table and fixed relative to a body member, for example a base plate, of the holder. Such contact surfaces can be flat, but for preference are rounded and can be formed by, for example, surfaces of balls of sapphire or other suitable material with a stable temperature characteristic, in particular low coefficient of thermal expansion. The individual stop members can extend downwardly, possibly via openings in the table, to the body member, where they can be mounted. Above the table, the stop members can extend across part of the area supporting the substrate, so that the stop members together define the reference plane without significantly obstructing the space above the table and thereby restricting movement of substrates to and from the table.

For preference, the locating means comprises resilient means to cause a supported substrate to be biased towards the table. A resiliently applied pressing force ensures firm location of the substrate, primarily in the z-axis direction and secondarily through the friction generated by the pressing force—in the x-axis and y-axis directions, but without the possibly damaging consequences of non-yielding clamping. The resilient means preferably comprises a resilient mounting of the table, so that components defining the reference plane can be rigidly located and are unaffected by the resilience in the locating system.

The resilient mounting can take the form of at least one compression spring supporting the table relative to, for example, the body member of the holder so that the table can yield in a direction away from the reference plane under compression of the spring or springs. An evenly distributed support of the table can be achieved by use of three such springs at mutual spacings, preferably below the regions in which the substrate is contacted by the contact surfaces of the stop members. The tendency of the compression springs to twist and thus impart rotation to the table can be counteracted by a supplementary anti-twist mounting of the table by way of at least one leaf spring, preferably three leaf springs disposed at mutual spacings.

The release means present in the apparatus preferably comprises displacing means to displace the table against the direction of bias by the resilient means, more specifically against the resilience of the table resilient mounting provided by, for example, the compression and leaf springs. The displacing means can comprise at least one displacing member movable to engage and depress the table, this movement preferably being opposed by resilient restoring means; the resilient mounting of the table will itself resist depression of the table, but the restoring means serves more specifically to move the displacement member or members back out of engagement with the table. The or each displacing member advantageously has the form of a pusher carried by an upwardly and downwardly movable carrier member, which is located in the loading and unloading chamber, and for preference three such pushers arranged at mutual spacings are provided. The three pushers ensure an even distribution of force applied to the table during pressing of the table against the resilient mounting and the resilient restoring means and can be spaced apart sufficiently to allow unrestricted access of substrates to the holder. The displacing means may further include drive means to cause downward movement of the carrier member, such drive means comprising, for example, lever means drivably engaging the carrier member and actuating means to pivot the lever means. The lever means can comprise at least one rocker member drivably engaging the carrier member by way of a roller, the rocker member being able to be arranged to provide considerable mechanical advantage in transmission of drive to the resiliently biassed carrier member. The actuating means can be situated outside the vacuum vessel and coupled to the lever means by way of coupling means passing through a vacuum-tight entry passage of the vessel. In that case the actuating means, which can be, for example, a pneumatic piston-cylinder unit, is preferably disposed below the vacuum vessel so as to assist in maintaining compact dimensions of the apparatus.

Apart from action to cancel the force serving to locate the substrate on the table, the release means provides temporary support for a substrate, preferably by way of temporary support means movable upwardly through passage means in the table. The temporary support means can be, for example, at least three spaced-apart pins defining a plane of temporary support by their upper ends. These upper ends can be formed by a material having stable thermal characteristics, for example a ceramic, the pins otherwise being of metal. The passage means can be an individual passage in the table for each support and a similar individual passage in the body member of the holder, although a single passage of sufficient size is equally possible in each case. To enable movement of the holder into and out of the loading and unloading chamber, the temporary support means is movable downwardly into a position clear of the holder. Movement of the temporary support means, in particular upward and downward movement between a position providing the temporary substrate support and a position permitting removal of the holder from the chamber, can be provided by suitable drive means which is for preference disposed outside the vacuum vessel and coupled to the temporary support means by way of coupling means passing through a vacuum-tight annexure of the vessel, for example a vacuum bell sealed relative to the coupling means by a bellows. The drive means, which can be a linear stepping drive, is preferably disposed below the vessel.

It has proved that if substrate loading into the holder is carried out remotely, i.e. within the vacuum environment without removal of the holder, it is desirable to make provision for fine angular adjustment of the substrate. The temporary support means is preferably utilised for this purpose, in particular by being arranged to be rotationally movable to angularly adjust the position of the substrate relative to the table while the substrate is supported by the temporary support means. Consequently, the apparatus preferably includes an adjusting drive, for example a linear actuator, drivingly connected with the temporary support means by a drive transmission providing the necessary rotary movement, but nevertheless accommodating the upward and downward movement of the temporary support means. The transmission can comprise a rotary member rotatable by the adjusting drive and connected with the temporary support means by a plurality of spaced-apart coupling pins coupled to a component fixed to the temporary support means so as to be secure against relative rotation, but axially displaceable relative to the component. The rotary member is preferably rotatably mounted in a wall of the vessel and can, in that case, provide the mounting point for the entire temporary support means. The adjusting drive, as in the case of the other drives or actuators, can be disposed outside the vessel, preferably laterally of the vessel, and coupled to the rotary member by coupling means again passing through a vacuum-tight entry passage of the vessel. This coupling means can have the form of a shaft incorporating a flexible portion permitting flexure to prevent transmission of non-rotational deflections. The fine adjustment provided by this system can be a stepless angular adjustment within a range up to about half a degree, but greater ranges of adjustment can be allowed if appropriate.

The fine adjustment facility is preferably associated with an optical system for determining the angular position of the temporarily supported substrate, such as image generating means for causing generation of an image of part of the substrate, an image detector for detecting the image and determining means for comparing the detected image with a reference image and determining, from the comparison result, the angular position of the substrate relative to a predetermined or target position. Image generation can be achieved by a light source and optical transmission means, such as a fibre-optic cable, for transmitting light from the source to produce a topographical image of part or all of the substrate top face. The image detection can be carried out with a microscope for detecting the image and a camera for recording the detected image and position determination can be performed by data processing means for software processing of data indicative of the orientation of the detected image and comparison of those data with data indicative of the orientation of the reference image. The optical system, which can be disposed above the vacuum vessel and act via a window let into a top wall of the vessel, can be associated with control means to control the rotational movement of the temporary support means in dependence on the instantaneous substrate angular position determined by the optical system.

Fine adjustment of the substrate angular position can thus be carried out in a fully automated manner. In addition, the upward and downward movement of the temporary support means can be utilised to bring the top face of the temporarily supported substrate into a focal plane of the optical system so that the generated image is precisely focussed.

The transfer port of the loading and unloading chamber is preferably disposed to enable lateral transfer of the holder between the chamber and the externally located evacuated region. The vessel defining the chamber is preferably box-shaped and the apparatus can include housings arranged above and below the vessel and accommodating functional components, such as the optical systems and various drives, of the apparatus, together with power feeds and controls. The apparatus as a whole can be constructed as a module attachable to a substrate processing machine.

The invention additionally embraces such a machine, in particular a processing machine which has an evacuatable region incorporating a substrate processing station and is equipped with the substrate loading and unloading apparatus, the apparatus communicating with the evacuatable region by way of the transfer port of the loading and unloading chamber. The region can further incorporate a transfer station for transfer of the substrate holder between the processing station and the chamber by way of the port and the machine can also have substrate feed means for feeding substrates into and removing substrates from the region, preferably via an air lock preserving the vacuum environment. Whilst the air lock itself may have to be relieved of vacuum and then pumped down again to restore the vacuum, this represents only a small part of the total evacuated region. The transfer station can additionally serve for transfer of substrates to and from the holder by way of the transfer port when the holder is in the loading and unloading chamber. Transfer of the holder and the substrates can be effected in each case by remotely actuable transfer means, such as a robotic handler with a lifting arm of suitable configuration. The machine itself can be, for example, an electron beam pattern-writing machine for writing patterns, such as integrated circuit layouts, on substrates in succession in the processing station.

BRIEF DESCRIPTION OF THE DRAWINGS

A preferred embodiment of the present invention will now be more particularly described by way of example with reference to the accompanying drawings, in which.

DETAILED DESCRIPTION OF THE INVENTION

Figure 1:
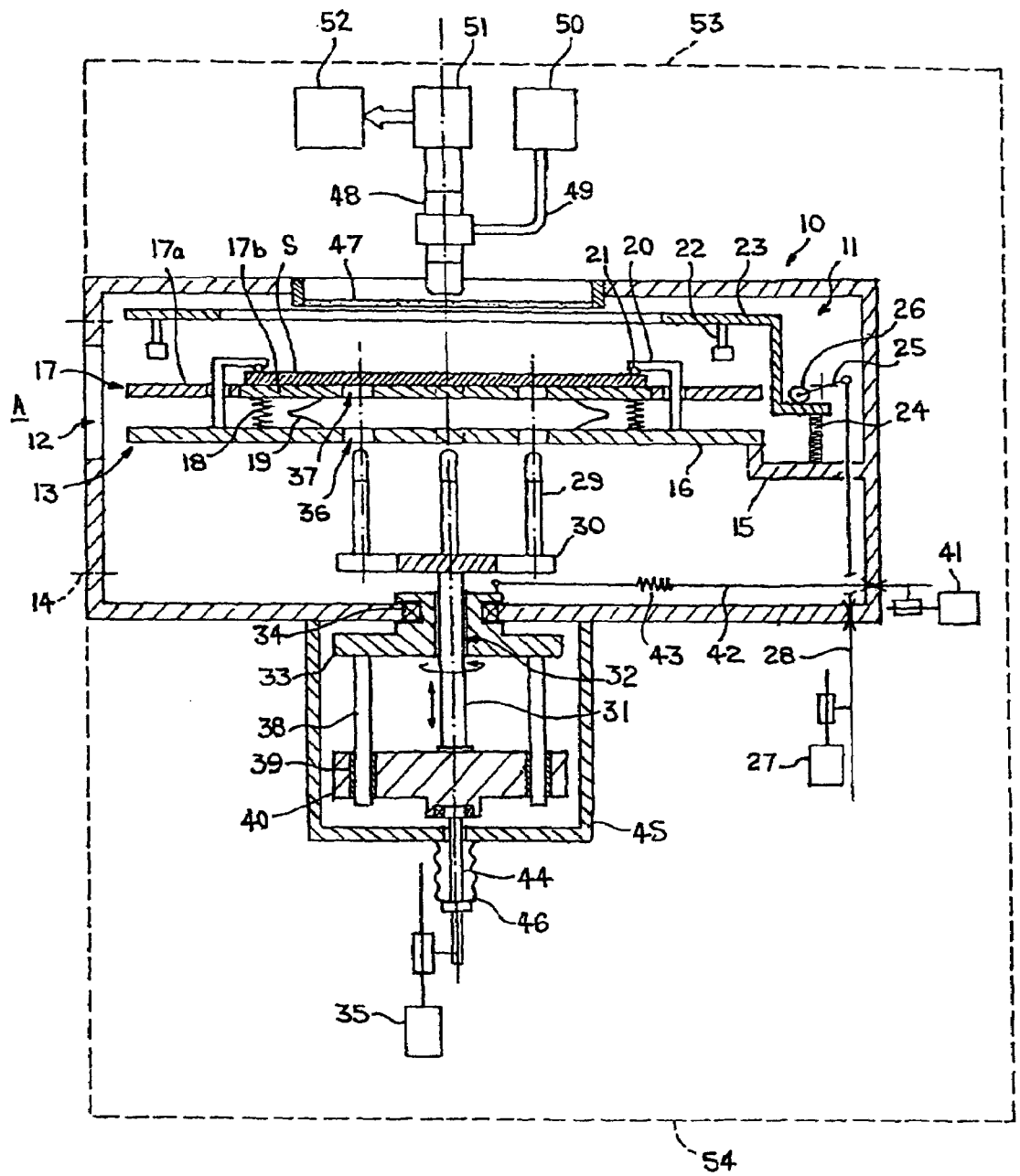
FIG. 1 is a schematic sectional elevation of substrate loading and unloading apparatus embodying the invention, showing the apparatus in a setting with a loaded and located substrate.

Referring now to the drawings, the depicted loading and unloading apparatus is shown in highly schematic form with components adapted in size, shape and disposition to assist clarity and understanding. In practice, many components are disposed in coincident or overlapping positions in different planes and the drawings should accordingly be seen primarily as an illustration of the nature and functional relationship of components, rather than the specific manner in which they are to be physically constructed and positioned.

The apparatus is, in the case of the present embodiment, designed as an essentially self-contained accessory module and is usable with any suitable machine for processing substrates in a vacuum environment. One particularly relevant form of machine is an electron beam lithography machine in which pattern writing is carried out by scanning substrates with an electron beam. The substrates can then be, for example, wafers or masks of, for example, silicon, gallium oxide or ceramic with electron-sensitive surface resists; such a wafer is typically a disc of 125 millimetre—or greater—diameter. Conventional practice with such machines is to scan individual substrates not only by controlled deflection of the beam, but also by periodic repositioning of the substrate on x and y axes. For that purpose the substrate is fixed in a holder which is in turn mounted on a stage movable with high degrees of precision in the x and y directions. In series production of pattern-written substrates, the holder together with a loaded substrate is placed on the stage prior to commencement of pattern writing, removed from the stage after completion of the writing, equipped with a fresh substrate and returned to the stage for repetition of the writing procedure. The electron beam acts on the substrates in a vacuum environment, for which purpose the region of the stage is evacuated and maintained in a state of underpressure until writing is completed. Disruption and subsequent restoration of this state by the actions necessary for substrate change have a considerable impact on production time in series pattern writing and a significant improvement in of this respect is offered by use of the substrate loading and unloading apparatus in association with such a machine in order to enable automated loading and unloading of substrates entirely in the vacuum environment, in particular without departure of the substrate holder from that environment.

Referring more specifically to the drawings, the apparatus comprises, as principal parts, a vacuum vessel 10 bounding a loading and unloading chamber 11 with a lateral transfer port 12 communicable with the mentioned evacuated region, denoted by A, of the machine, a substrate holder 13, and functional elements associated with the vessel and serving for release of a substrate S from the holder and provision of temporary support for a substrate after unloading from or prior to loading onto the holder.

The vessel 10 is box-shaped and constructed from machined aluminium plates bolted together, with interposition of suitable gaskets or other sealing means, to provide an enclosure forming the loading and unloading chamber 11. The chamber 11 is hermetically sealed apart from the transfer port 12. The vessel 10 is intended to be secured by bolts 14 and an intermediate gasket to a wall of a vacuum compartment defining the evacuated region A of the processing machine. The compartment wall has a port mating with the transfer port 12. The part of the region A immediately adjoining the vessel 10 functions as a transfer station and communicates at one side with a processing station, for example a pattern-writing station of the machine and at another side with a substrate feed point. Substrates supplied individually or from a magazine at the feed point are transferred one at a time via the transfer station to the chamber 11 for loading onto the holder 13 and the loaded holder 13 is then transferred via the transfer station to the processing station, where it can be mounted on the above-mentioned x/y stage and the substrate S then appropriately processed. After processing of the substrate, the holder is returned to the chamber 11 and unloaded, the processed substrate is returned to the feed point and the procedure repeated with the next substrate. The movement of the substrates and the holder can be carried out by a remotely actuable robotic handler operating in the transfer station and engaging into the chamber 11 of the vessel 10 and into the processing station, as well as taking over substrates at and returning substrates to the feed point. The feed point can incorporate an air lock so that ingress and egress of substrates entails a minimal amount of repeated reinstatement of vacuum to make good the loss on venting the air lock to the ambient temperature.

The holder 13 is shown disposed in the chamber 11 of the vessel 10 at a spacing from the top and bottom walls of the vessel. The holder is depicted resting on a ledge 15 which is, however, merely symbolically representative of various possible ways of providing support; in practice, support can be provided by, for example, three kinematic mounts controlling height and orientation. The support should be such that the handler can pick up and set down the holder, for example by engagement underneath, via the transfer port 12. The holder 13 basically consists of a body member in the form of a base plate 16 of a synthetic quartz-based glass with high mechanical and thermal stability, such as 'Zerodur' (registered trademark), and a two-part substrate support table 17 resiliently mounted on the base plate 16. The table consists of an outer carrier plate 17a carrying a chuck disc 17b which is slightly larger in diameter than the substrate S and can retain the substrate electrostatically. For this purpose the chuck disc 17b can consist of, for example, a ceramic with a zero coefficient of expansion at room temperature and with a metal layer at its underside, the ceramic functioning as a dielectric body on application of voltage to the layer. Electrostatic retention of the substrate assists in achieving or maintaining planarity of the substrate, which as supplied may be bowed or embody some other form of deformation or warpage. Non-planarity of a substrate can be a source of writing error in certain critical applications, but is of less consequence in others and use of an electrostatic chuck disc is optional.

Figure 2:
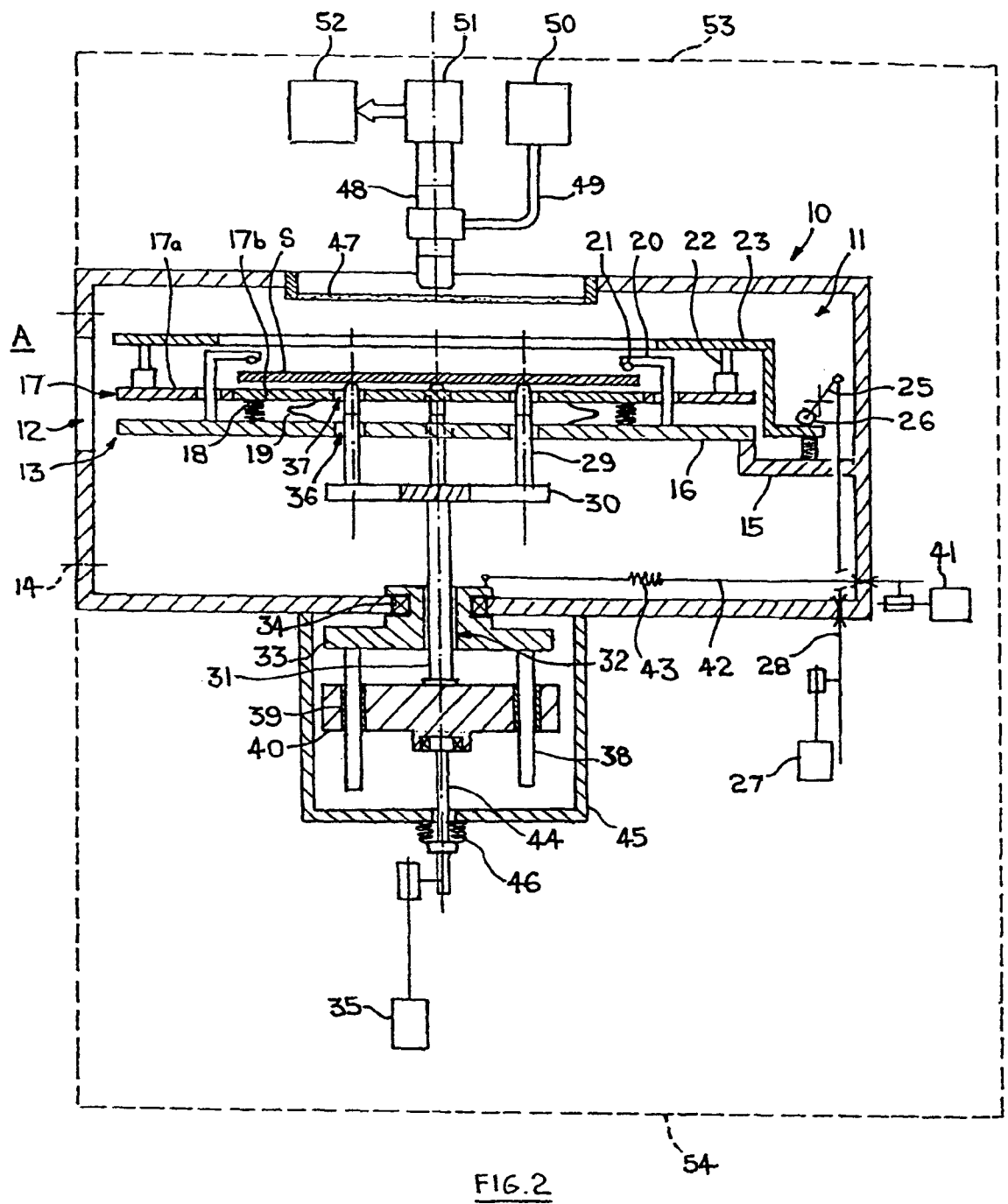
FIG. 2 is a view similar to FIG. 1, but showing the apparatus in a setting with a substrate released from location (or prior to location).

Resilient mounting of the table 17 on the base plate 16 is provided by three approximately equidistantly spaced compression springs 18 (only two shown in the drawings) which constantly bias the table upwardly towards stop members as described further below and which permit depression of the table to approach the base plate 16 as shown in FIG. 2. Since the compression springs are inherently liable to twisting, security of the table 17 against rotation relative to the base plate 16 is provided by a supplementary mounting in the form of three spaced-apart leaf springs 19 (only two shown in the drawings) fastened to the underside of the table and top of the base plate in such a manner as to resist any tendency to relative rotation.

The stop members limiting upward displacement of the table 17 under the bias of the resilient mounting are provided by three arms 20 (only two shown) fixed to the base plate 16 and protruding upwardly through corresponding bores in the table and extending across the top of the table inwardly of the perimeter of the chuck disc 17b, the arms 20 carrying balls 21 of thermally stable material, for example sapphire, at their free ends. The balls 21 pressurably bear on the edge zone of the substrate S positioned on the table 17. The stop members represented by the arms 20 and balls 21 and the resilient mounting represented by the springs 18 and 19 thus co-operate with the table to locate the substrate S. This location is primarily in the z direction.

Location of the substrate in the x and y directions is provided to a lesser extent by the friction couple between the balls and the substrate top face. However, the balls 21, or at least their surface portions for contacting the substrate (effectively punctiform contacts), are disposed in a precisely defined reference plane so that the top face of the located substrate S is similarly disposed in that plane. This ensures repeatably accurate positioning of successive substrates loaded onto the holder 13.

The balls 21 are merely examples of suitable contacting elements. Titanium or other materials can be used instead of sapphire and although the contacting surfaces are preferably rounded to provide contact points, flat contacting surfaces are equally possible.

The arms 20 together with the balls 21 are approximately equidistantly disposed to ensure an equal distribution of locating pressure and are preferably positioned in the regions in which the compression springs 18 act, so as to provide direct opposition to the force of the springs.

Release of the substrate S located on the table 17, or preparation of the holder for loading with a new substrate, is effected by a release system, which on the one hand causes the table to be urged towards the base plate 16 against the resilient bias in order to relieve the pressurable engagement of the balls 21 with the substrate and which on the other hand provides a temporary support for the substrate S—or a new substrate—above the table. Depressing of the table is performed by three approximately equidistantly spaced pusher studs 22 (only two shown) carried by a centrally apertured carrier plate 23 of high rigidity movable downwardly from the rest setting shown in FIG. 1 to the operative setting shown in FIG. 2 against the force of restoring springs 24, only one of which is shown. On initial downward movement of the carrier plate 23, the studs 22 are brought into engagement with the top face of the table 17 and on continuing downward movement of the carrier plate the table is urged towards the base plate 16 of the holder to release the substrate. Downward movement of the carrier plate 23 together with the studs 22 is produced by a rocker 25 bearing on a slide surface of the carrier plate by way of a roller 26. Return upward movement is effected by the restoring springs 24. The rocker 25 is pivoted by a pneumatic piston-cylinder unit 27 disposed below the vessel 10 and coupled to the rocker by a coupling rod 28 passing through a vacuum-tight passage in the lower wall of the vessel, the speed of action of the unit 26 and thus the rate of lowering of the carrier plate 23 being controlled by flow control valves in the pneumatic system of the unit. In a practical construction, two such rockers are provided, one at each of two opposite sides of the carrier plate 23 and each bearing by way of the associated roller on a slide surface at the base of a respective depending lateral flange of the plate. The rockers are rigidly interconnected at their ends remote from the rollers by a cross bar, which is centrally connected with the coupling rod. The drawings depict the rocker drive of the carrier plate 23 only symbolically.

The temporary substrate support included in the release system is formed by three substantially equidistantly spaced stainless steel pins 29 which have top portions of, for example, polyetberetherketone or other plastics material with stable properties with respect to thermal expansion and which are carried by a triple-arm carrier 30 mounted on an axially displaceable shaft 31. The shaft 31 passes through a bore 32 in a rotary member 33, which is rotatably mounted in the lower wall of the vessel 10 by way of a ball-bearing 34. The shaft 31 together with the pins 29 is displaceable upwardly and downwardly by an electrically operated linear stepper drive 35 coupled to the shaft by a rotary coupling as detailed further below.

Upward movement of the pins 28 is accommodated by respectively aligned bores 36 in the base plate 16 of the holder 13 and bores 37 in the chuck disc 17b of the table 17 of the holder. The bores have the same triangular disposition as the pins 29 and one set of aligned bores, which necessarily lies in a sectional plane offset relative to any plane containing the other sets, is indicated merely by dashed lines. The pins 29 are movable between a lowermost position shown in FIG. 1, in which the pins are fully retracted from the holder so that movement of the holder into and out of the chamber 11 is unobstructed, and an uppermost position shown in FIG. 2, in which the free ends of the pins are disposed slightly below the top face of the table 17—thus below the bottom face of the substrate S—in relation to the holder configuration illustrated in FIG. 1. In the case of the holder configuration illustrated in FIG. 2, in which the table 17 is depressed, the free ends of the pins 29 have passed entirely through the bores 37 in the table and emerged above the top face of the table, so as to define a temporary substrate support plane above the table. This temporary support plane is accurately defined by setting the pin free ends with a tolerance of ±5 microns with respect to an ideal plane.

The preferred sequence with regard to pin and table displacement is to raise the pins 29 to the above-mentioned uppermost position and then depress the table 17 by way of the studs 22, so that a substrate located on the table is transferred from support by the table to support by the pins during downward travel of the table. It is possible, but not preferred, to depress the table and then raise the pins to lift the substrate off the table.

With the substrate S temporarily supported clear of the table 17, as shown in FIG. 2, space is created to enable engagement of the robotic handler below the substrate so that it can be removed from the vicinity of the holder and transported out of the chamber 11 via the transfer port 12. This would be required after processing of the substrate in the processing station of the associated machine. The pins 29 remain raised and the table 17 remains depressed until the handler returns with a new substrate, which is placed on the temporary support provided by the free ends of the pins. The table 17 can then be raised by relaxation of its resilient mounting after relief of the rocker pneumatic control unit 27 and return of the carrier plate 23 and studs 22 to the uppermost position (FIG. 1) under the action of the restoring springs 24. The newly supplied substrate is thereby lifted off the pins 29 by the upwardly moving table 17 and is located on the table in at least the z direction by pressurable engagement with the three balls 21 of the arms 20.

In the case of substrates with specific pre-existing topographical features, a precise angular orientation on the table 17 is necessary to ensure the requisite degree of accuracy in the processing phase, such as the writing of an integrated circuit pattern on a field-by-field basis with pattern details mating at contiguous field boundaries. For this reason the release system, in particular the temporary support means represented by the pins 29 and associated components, includes a facility for rotational adjustment within a small angular range, for example up to about half a degree, of each newly arrived substrate deposited on the pins 29 and prior to transfer to the table 17. Rotation of the substrate by way of the pins 29, with which the substrate has a frictional couple, is transmitted from the rotary member 33 which has three depending coupling pins 38 (only two shown) slidably engaged in bushes 39 in a block 40 fixed to the shaft 31 to be secure against rotation relative thereto. The member 33, pins 38, block 40 and shaft 31 provide a torsionally stiff assembly to eliminate play or backlash in the angular adjustment of the pins 29 and supported substrate. Rotary drive of the assembly is imparted by way of a micro-stepping linear actuator 41 disposed laterally outside the vessel 10 and coupled to the rotary member 33 by way of a coupling rod 42 passing through a vacuum-tight entry passage in a side wall of the vessel and articulated to an eccentric post fixed to the top of the member 33. The coupling rod 42 incorporates a flexible portion 43 permitting flexure of the connection with actuator 41 to avoid uncontrolled influence on the substrate position. The passages 36 and 37 in, respectively, the base plate 16 and table 17 must be shaped or otherwise dimensioned to accommodate the small amount of arcuate movement of which the pins 29 are capable.

The rotary coupling of the drive 35 to the shaft 31 is provided by a drive rod 44 connected with the block 40, to which the shaft is fixed, by a ball-bearing at the base of the block. The subassembly formed by the member 33, pins 38 and block 40 together with parts of the shaft 31 and drive rod 44 are enclosed by a vacuum bell 45 which is sealably connected with the vessel 10 and in which the vacuum environment of the vessel similarly prevails. Vacuum-tightness of the bell and thus of the vessel with respect to the shaft ingress/egress point represented by the bore 32 is provided by a bellows 46 connected between the bell and the drive rod 44 and accommodating the axial motion of the latter.

The angular position of a temporarily supported substrate prior to and during adjustment is detected by an optical system mounted above the vessel 10. Optical detection is carried out by way of a glass pane 47 let into and sealed relative to the top wall of the vessel 10, the pane having a cushioned mounting to permit yielding under the effect of vacuum force without cracking. The optical system comprises a microscope 48 oriented towards the pane 47 and mounted for movement in x and y axial directions on a translation stage (not shown). The microscope incorporates inter alia an intermediate and a final focussing lens. Light is supplied by way of a fibre-optic cable 49 from a light source 50 and generates a light ring which is transmitted in the form of a diffuse cone to illuminate the top face of the substrate. Reflected light from topographical features of the substrate top face is detected by the microscope 48 as an image of feature boundaries. The image is recorded by a camera 51 associated with the microscope 48 and data indicative of the image is passed to a software-programmable data processor 52 for image recognition and comparison with data indicative of a reference image characterising the desired image orientation, thus orientation of the feature and, by extension, the substrate. On the basis of the comparison result the data processor can, for example, act on a control system to influence operation of the actuator 41 to rotate the rotary member 33 together with the temporary support pins 29 until attainment of a predetermined angular position of the supported substrate. Focussing of the microscope relative to the substrate top face can be achieved not only by the microscope lens, but also by, if required, axial displacement of the pins 29 to vary the height of the supported substrate.

The components of the apparatus located externally of the vessel 10, i.e. the drives 29, 35 and 41, together with parts of the associated drive transmission, the optical system and operating energy supply lines and controls are disposed in an upper housing 53 and a lower housing 54 so that the apparatus has the form, as already mentioned, of a self-contained accessory module.

The function of the apparatus will be evident from the foregoing description of the operation of the individual components by themselves and their interaction with other components. The sequence of loading a substrate onto the holder 13 in the loading and unloading chamber 11, locating the substrate on the holder, transferring the loaded holder to the machine processing station, returning the holder with the processed substrate to the chamber, unloading the holder and transporting the removed substrate to the machine departure point (air lock) can be carried out automatically by preset sequence control of the apparatus drives and the machine remotely actuable handler and without change in the vacuum environment prevailing in the machine transfer and processing stations and in the chamber 11. Operator intervention in the control of stages of the sequence can, of course, be permitted. Similarly, adjustment of the rotational position of each newly loaded substrate, prior to final location, can be performed automatically under software control of the optical system. Again operator intervention can be permitted to trigger individual phases or to, for example, allow data input of parameters for recognition of different feature images. Significant improvements in substrate processing times may thus be achievable in conjunction with accurate handling and alignment of substrates for consistently repeatable processing results.

What is claimed is:

1. An apparatus for automated loading and unloading of substrates in a vacuum environment, the apparatus comprising:
    a vacuum vessel in the form of an enclosure bounding a loading and unloading chamber and defining a transfer port in communication with the chamber and with an evacuated region outside the vacuum vessel;
    a substrate holder in the chamber, the substrate holder comprising a substrate support table for supporting a substrate, and locating means co-operable with the substrate support table for causing a substrate which is supported thereon to be pressed against and thereby located on the substrate support table; and
    release means in the chamber, the release means being adapted for withholding said co-operation of the locating means with the substrate support table and providing a temporary support of the substrate clear of the substrate support table so as to permit movement of the substrates to and from the substrate holder;
    wherein the loading and unloading chamber is hermetically sealed apart from the transfer port to allow for a vacuum environment to prevail in the loading and unloading chamber; and
    wherein the transfer port allows transfer of the substrate holder between the chamber and the evacuated region outside the vacuum vessel.

2. The apparatus as claimed in claim 1, wherein the locating means defines a reference plane for a top face of the supported substrate.

3. The apparatus as claimed in claim 2, wherein the reference plane is defined by three spaced-apart contact points for contacting the substrate top face.

4. The apparatus as claimed in claim 3, wherein the contact points are provided by contact surfaces of stop members disposed above the substrate support table and fixed relative to a body member of the substrate holder.

5. The apparatus as claimed in claim 1, wherein the locating means comprises resilient means to cause a supported substrate to be biased towards the substrate support table.

6. The apparatus as claimed in claim 5, wherein the resilient means comprises a resilient mounting of the substrate support table.

7. The apparatus as claimed in claim 6, wherein the resilient mounting comprises at least one compression spring.

8. The apparatus as claimed in claim 7, wherein the resilient means comprises at least one leaf spring arranged to provide an anti-twist mounting of the substrate support table.

9. The apparatus as claimed in claim 5, wherein the release means comprises displacing means to displace the substrate support table against the direction of bias by the resilient means.

10. The apparatus as claimed in claim 9, wherein the displacing means comprises at least one displacing member movable to engage and depress the substrate support table.

11. The apparatus as claimed in claim 10, comprising resilient restoring means to oppose movement of the at least one displacement member to engage and depress the substrate support table.

12. The apparatus as claimed in claim 11, wherein the at least one displacing member comprises a pusher carried by an upwardly and downwardly movable carrier member, and wherein the displacing means further comprises drive means to cause downward movement of the carrier member.

13. The apparatus as claimed in claim 12, wherein the drive means comprises lever means drivably engaging the carrier member and actuating means to pivot the lever means.

14. The apparatus as claimed in claim 13, wherein the lever means comprises at least one rocker drivably engaging the carrier member by way of a roller.

15. The apparatus as claimed in claim 13, wherein the actuating means is disposed outside the vacuum vessel and coupled to the lever means by way of coupling means passing through a vacuum-tight entry passage of the vessel.

16. The apparatus as claimed in claim 15, wherein the actuating means is disposed below the vacuum vessel.

17. The apparatus as claimed in claim 13, wherein the actuating means comprises a pneumatic piston-cylinder unit.

18. The apparatus as claimed in claim 1, wherein the release means comprises temporary support means movable upwardly through passage means in the substrate support table to provide the temporary substrate support.

19. The apparatus as claimed in claim 18, wherein the temporary support means comprises at least three spaced-apart axially movable support pins defining a plane of temporary support by their upper ends.

20. The apparatus as claimed in claim 19, wherein the passage means comprises an individual passage in the substrate support table for each support pin.

21. The apparatus as claimed in claim 18, wherein the temporary support means is movable downwardly to a position clear of the substrate holder.

22. The apparatus as claimed in claim 18, wherein the release means comprises drive means to move the temporary support means upwardly and downwardly between a position providing the temporary substrate support and a position permitting removal of the substrate holder from the loading and unloading chamber.

23. The apparatus as claimed in claim 22, wherein the drive means is disposed outside the vacuum vessel and coupled to the temporary support means by way of coupling means passing through a vacuum-tight annexure of the vessel.

24. The apparatus as claimed in claim 23, wherein the drive means is disposed below the vessel.

25. The apparatus as claimed in claim 22, wherein the drive means comprises a linear stepping drive.

26. The apparatus as claimed in claim 18, wherein the temporary support means is rotationally movable to angularly adjust the position of the temporarily supported substrate relative to the substrate support table.

27. The apparatus as claimed in claim 26, comprising an adjusting drive drivingly connected to the temporary support means by drive transmission means providing rotary movement of the temporary support means, but accommodating the upward movement of the temporary support means.

28. The apparatus as claimed in claim 27, wherein the drive transmission means comprises a rotary member rotatable by the adjusting drive and connected to the temporary support means by a plurality of spaced-apart coupling pins so coupled to a component fixed to the temporary support means as to be secure against relative rotation, but axially displaceable relative to the component.

29. The apparatus as claimed in claim 28, wherein the rotary member is rotatably mounted in a wall of the vessel.

30. The apparatus as claimed in claim 27, wherein the adjusting drive is disposed outside the vacuum vessel and coupled to the rotary member by coupling means passing through a vacuum-tight entry passage of the vessel.

31. The apparatus as claimed in claim 30, wherein the coupling means comprises a shaft incorporating a flexible portion permitting flexure of the shaft.

32. The apparatus as claimed in claim 30, wherein the adjusting drive is disposed laterally of the vessel.

33. The apparatus as claimed in claim 27 wherein the adjusting drive comprises a linear actuator.

34. The apparatus as claimed in claim 27, wherein the adjusting drive is operable to provide stepless angular adjustment within a range up to substantially half a degree.

35. The apparatus as claimed in 26, comprising an optical system to determine an angular position of the temporarily supported substrate.

36. The apparatus as claimed in claim 35, wherein the optical system comprises image generating means for causing generation of an image of part of the substrate, image detecting means for detecting the image and determining means for comparing the detected image with a reference image and determining therefrom the angular position of the substrate relative to a target position.

37. The apparatus as claimed in claim 36, wherein the image generating means comprises a light source and optical transmission means for transmitting light from the source to produce a topographical image of at least part of a top face of the substrate.

38. The apparatus as claimed in claim 36, wherein the image detecting means comprises a microscope for detecting the image and a camera for recording the detected image.

39. The apparatus as claimed in claim 36, wherein the determining means comprises data processing means for software processing of data indicative of the orientation of the detected image and comparison thereof with data indicative of the orientation of the reference image.

40. The apparatus as claimed in claim 35, wherein the optical system is disposed above the vacuum vessel.

41. The apparatus as claimed in claim 26, comprising control means to control rotational movement of the temporary support means in dependence on the substrate angular position determined by the optical system.

42. The apparatus as claimed in claim 26, wherein the temporary support means is additionally movable upwardly and downwardly to bring the top face of the temporarily supported substrate into a focal plane of the optical system.

43. The apparatus as claimed in claim 1, wherein the transfer port is disposed to enable lateral transfer of the substrate holder between the evacuated region and the loading and unloading chamber.

44. The apparatus as claimed in claim 1, wherein the vacuum vessel is substantially box-shaped and the apparatus includes housings arranged above and below the vacuum vessel and accommodating functional components of the apparatus.

45. The apparatus as claimed in claim 1, the apparatus being constructed as a module attachable to a substrate processing machine with a chamber defining the evacuated region.

46. A substrate processing machine having an evacuated region and a substrate processing station within the evacuated region, the machine comprising an adjustable loading and unloading apparatus comprising:
 a vacuum vessel in the form of an enclosure bounding a loading and unloading chamber and defining a transfer port in communication with the chamber and, outside the vacuum vessel, with the evacuated region;
 a substrate holder within the chamber, comprising a substrate support table for supporting a substrate and locating means co-operable with the substrate support table for causing a substrate which is supported thereon to be pressed against and thereby located on the substrate support base and
 release means within the chamber, the release means being adapted for withholding said co-operation of the locating means with the substrate support table and providing a temporary support of the substrate clear of the substrate support table so as to permit movement of substrates to and from the substrate holder,
 wherein the loading and unloading chamber is hermetically sealed apart from the transfer port to allow for a vacuum environment to prevail in the loading and unloading chamber; and
 wherein the transfer port allows transfer of the substrate holder between the chamber and the evacuated region outside the vacuum vessel.

47. The machine as claimed in claim 46, wherein the evacuated region further incorporates a transfer station for transfer of the substrate holder between the processing station and the loading and unloading chamber by way of the transfer port.

48. The machine as claimed in claim 46, wherein the machine includes substrate feed means for feeding substrates into and removing substrates from the evacuated region.

49. The machine as claimed in claim 48, wherein the feed means comprises an air lock to preserve a vacuum environment of the evacuated region during feed of substrates.

50. The machine as claimed in claim 47, comprising remotely actuable transfer means for effecting the substrate holder transfer.

51. The machine as claimed in claim 47, wherein the transfer station additionally serves for transfer of substrates to and from the substrate holder by way of the transfer port when the substrate holder is in the loading and unloading chamber.

52. The machine as claimed in claim 51, comprising remotely actuable transfer means for effecting the substrate transfer.

53. The machine as claimed in claim 46, the machine being an electron beam pattern-writing machine for writing patterns on substrates in succession in the processing station.

* * * * *